United States Patent [19]

Tsunashima

[11] Patent Number: 6,087,719
[45] Date of Patent: Jul. 11, 2000

[54] CHIP FOR MULTI-CHIP SEMICONDUCTOR DEVICE AND METHOD OF MANUFACTURING THE SAME

[75] Inventor: Yoshitaka Tsunashima, Yokohama, Japan

[73] Assignee: Kabushiki Kaisha Toshiba, Kawasaki, Japan

[21] Appl. No.: 09/064,984

[22] Filed: Apr. 23, 1998

[30] Foreign Application Priority Data

Apr. 25, 1997 [JP] Japan ................................ 9-109130

[51] Int. Cl.$^7$ ........................................... H01L 23/02
[52] U.S. Cl. ..................... 257/686; 257/698; 257/777; 257/774; 257/723; 257/434; 250/548; 250/559.29; 250/559.3; 250/481.1; 356/6; 356/399
[58] Field of Search ........................... 257/431, 436, 257/433, 434, 432, 79–82, 88, 99, 686, 688, 698, 680, 774, 777, 678, 723; 250/548, 559.29, 559.3, 491.1; 438/109, 108, 106; 361/735, 790; 356/6, 399

[56] References Cited

U.S. PATENT DOCUMENTS

| | | |
|---|---|---|
| 4,499,655 | 2/1985 | Anthony . |
| 4,807,021 | 2/1989 | Okumura . |
| 5,270,261 | 12/1993 | Bertin et al. . |
| 5,637,907 | 6/1997 | Leedy ........................................ 257/434 |
| 5,821,549 | 10/1998 | Talbot et al. ............................ 250/307 |

FOREIGN PATENT DOCUMENTS 60-160645  8/1985  Japan .

*Primary Examiner*—Tom Thomas
*Assistant Examiner*—Luan Thai
*Attorney, Agent, or Firm*—Finnegan, Henderson, Farabow, Garrett & Dunner, L.L.P.

[57] ABSTRACT

A plurality of chips each having two or more alignment holes for transmitting a laser beam are stacked. The laser beam is irradiated onto the uppermost or lowermost one of the stacked chips. A photodetector detects the laser beam output from the stacked chips through the alignment holes in these chips. The positions of the chips are so controlled that the amount of the light detected by this photodetector is a maximum.

6 Claims, 8 Drawing Sheets

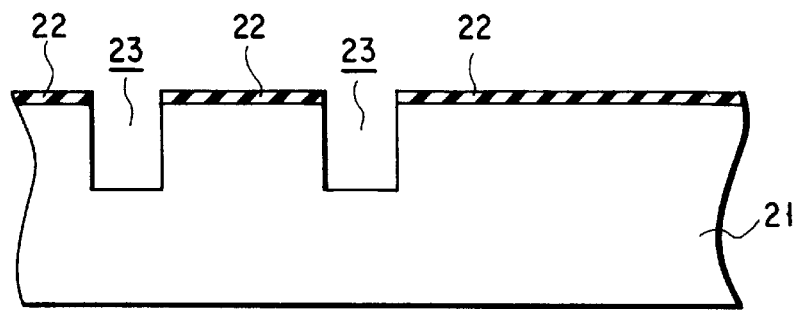
F I G. 4A
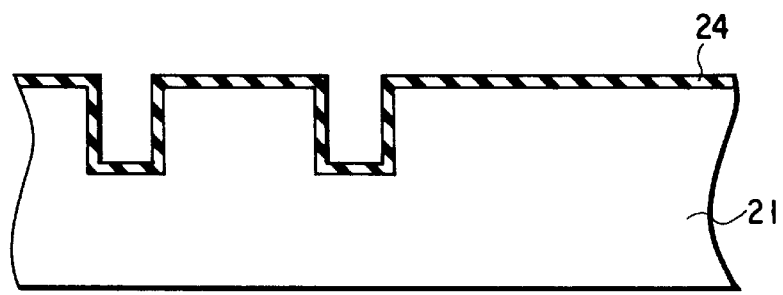
F I G. 4B
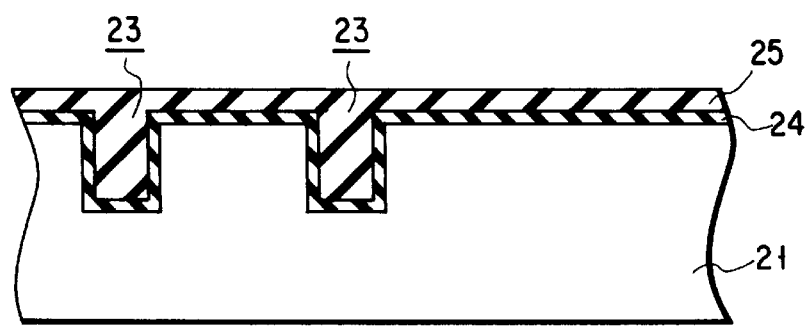
F I G. 4C
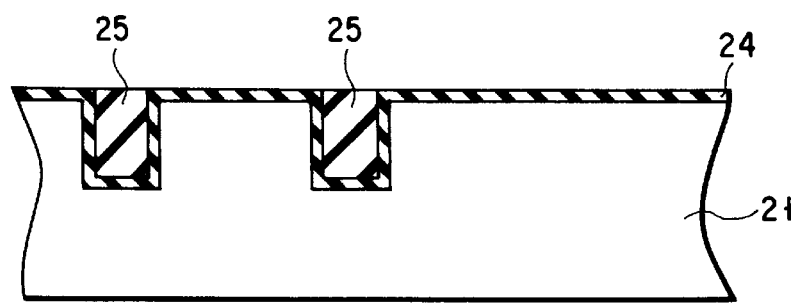
F I G. 4D

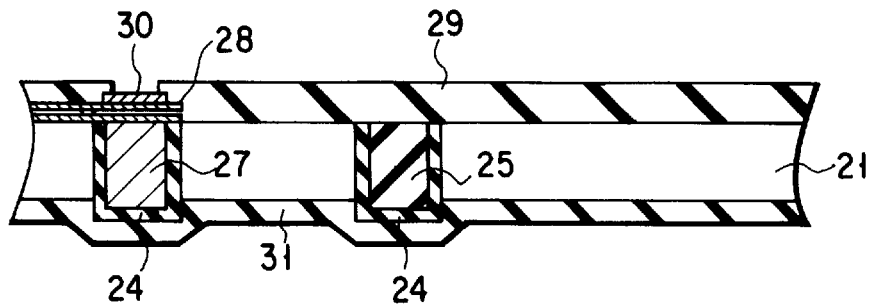
F I G. 4 I
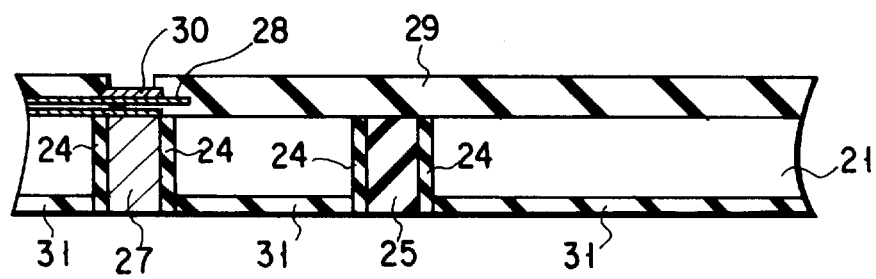
F I G. 4 J
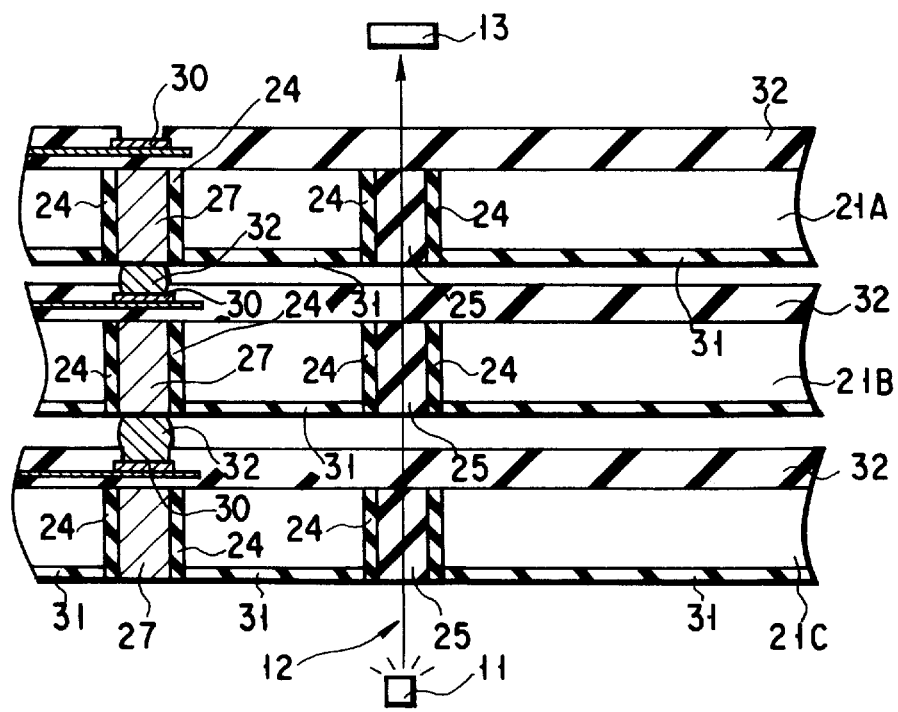
F I G. 4 K

CHIP FOR MULTI-CHIP SEMICONDUCTOR DEVICE AND METHOD OF MANUFACTURING THE SAME

BACKGROUND OF THE INVENTION

The present invention relates to a multi-chip semiconductor device and a chip to be applied to this device and, more particularly, to a multi-chip semiconductor device effective to improve alignment and a chip to be applied to this device.

This application is based on Japanese Patent Application No. 9-109130, filed on Apr. 25, 1997, the content of which is incorporated herein by reference.

Recently, a very large scale integrated circuit (chip) manufactured by integrally forming a number of elements such as transistors and resistors on a semiconductor substrate is often used in an important portion of a computer or a communication apparatus. The performance of this chip is closely related to the performance of a whole apparatus.

On the other hand, a so-called multi-chip semiconductor module has been proposed in which a plurality of chips are stacked to improve the performance of a whole apparatus. Recently, the assignee of the present application has proposed a multi-chip semiconductor device chip, three or more of which can be connected in a small space by a simple method, and a method of forming the chip (U.S. patent application Ser. No. 08/377,486 filed on Aug. 20, 1999.

One characteristic feature of this chip is that a through hole is formed in a semiconductor device on which elements are integrally formed and a connecting plug made of a conductive material is formed in this through hole. Chips are electrically connected via these connecting plugs to accomplish a multi-chip semiconductor device including a plurality of stacked chips.

In this multi-chip semiconductor device, pads made of a conductive material are used to connect connecting plugs of different chips or to electrically connect connecting plugs of different chips and a multilevel interconnecting layer. This pad has a solder bump.

When misalignment between chips is taken into consideration, it is necessary to form a pad having a relatively large area. This is so because the solder bump described above and a connecting plug to be connected to this solder bump are not connected in some cases due to misalignment between the chips. However, forming such pads having a large area is contrary to demanding improved performance by forming pads as many as possible in a chip in order to reduce the parasitic resistance in the interconnecting layer.

BRIEF SUMMARY OF THE INVENTION

It is an object of the present invention to provide a multi-chip semiconductor device by which high-accuracy alignment is possible and a chip to be applied to this device.

It is a second object of the present invention to provide a method and an apparatus for manufacturing the multi-chip semiconductor device.

It is a third object of the present invention to provide a method of manufacturing a chip to be applied to the multi-chip semiconductor device, and a method of aligning the chips.

According to an aspect of the present invention, there is provided a chip applied to a multi-chip semiconductor device, comprising: a semiconductor substrate on which at least one element is formed; a connecting portion formed in the semiconductor substrate and electrically connected to another chip; and two or more light-transmitting portions formed in the semiconductor substrate.

According to the second aspect of the present invention, there is provided a method of manufacturing a chip applied to a multi-chip semiconductor device, comprising the steps of: forming a plurality of holes having a desired depth in a surface of a semiconductor substrate; forming an insulating film on side walls and bottoms of the holes; burying a conductive material in the holes except for at least two holes; and exposing the conductive material by polishing a surface of the semiconductor substrate away from the surface in which the holes are formed.

According to the third aspect of the present invention, there is provided a method of aligning a plurality of stacked chips each having a light-transmitting portion, comprising the steps of: irradiating light onto one of uppermost and lowermost chips of the stacked chips; detecting light output from the stacked chips through the light-transmitting portions of the chips; and aligning the chips in accordance with the detected light.

According to the fourth aspect of the present invention, there is provided a multi-chip semiconductor device comprising: a plurality of stacked chips; and a plurality of conducting portions each formed between the chips, wherein each of the chips comprises: a semiconductor substrate on which at least one element is formed; a connecting portion formed to extend through the semiconductor substrate and electrically connected to an adjacent chip via the conducting portions arranged on both surfaces of the semiconductor substrate; and two or more light-transmitting portions formed in the semiconductor substrate.

According to the fifth aspect of the present invention, there is provided a method of manufacturing a multi-chip semiconductor device, comprising the steps of: manufacturing a plurality of semiconductor substrates; stacking the semiconductor substrates; arranging a plurality of conducting portions between the semiconductor substrates; aligning the semiconductor substrates; and electrically connecting the semiconductor substrates, wherein the step of manufacturing the semiconductor substrates comprises the substeps of: forming a plurality of holes having a desired depth in a surface of a semiconductor substrate; forming an insulating film on side walls and bottoms of the holes; burying a conductive material in the holes except for two holes; and exposing the conductive material by polishing a surface of the semiconductor substrate away from the surface in which the holes are formed, and the step of performing alignment comprises the substeps of: irradiating light onto one of uppermost and lowermost semiconductor substrates of the stacked semiconductor substrates; detecting light output from the stacked semiconductor substrates through holes except for the holes formed in the semiconductor substrates and filled with the conductive material; and aligning the semiconductor substrates in accordance with the detected light.

According to the sixth aspect of the present invention, there is provided an apparatus for manufacturing a multi-chip semiconductor device, comprising: a holding mechanism for stacking and holding a plurality of semiconductor substrates each having a light-transmitting portion in a predetermined position; a coarse adjustment unit for coarsely moving each of the semiconductor substrates; a fine adjustment unit for finely moving each of the semiconductor substrates; a light source for irradiating light onto one of uppermost and lowermost semiconductor substrates of the semiconductor substrates; a light-receiving unit for detecting light output from the stacked semiconductor substrates through the light-transmitting portions formed in the semiconductor substrates; and a controller for controlling the coarse adjustment unit and the fine adjustment unit in accordance with an amount of the light detected by the light-receiving unit, thereby aligning the semiconductor substrates.

In the present invention as described above, high-accuracy alignment can be performed by using multi-chip semiconductor device chips having light-transmitting portions (hollow portions) for alignment.

This obviates the need for forming pads having a relatively large area by taking account of misalignment, unlike in conventional structures. Consequently, it is possible to form a large number of pads in a chip and reduce the parasitic resistance in the interconnecting layer.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A to 4K are sectional views for explaining a method of manufacturing a multi-chip semiconductor device according to the second embodiment of the present invention;

DETAILED DESCRIPTION OF THE INVENTION

Embodiments of the present invention will be described below with reference to the accompanying drawings.

The first embodiment of the present invention will be described with reference to FIGS. 1 to 3B.

Figure 1:
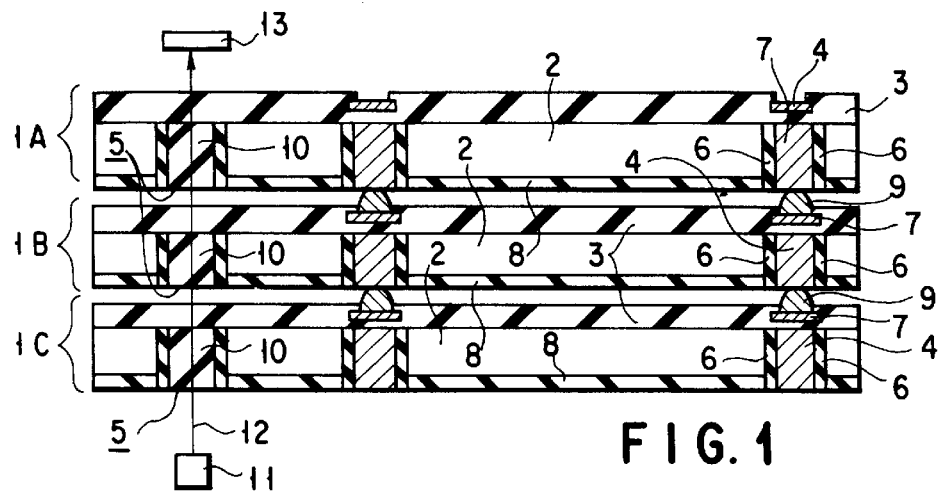
FIG. 1 is a sectional view showing a multi-chip semiconductor device according to the first embodiment of the present invention.
Figure 2:
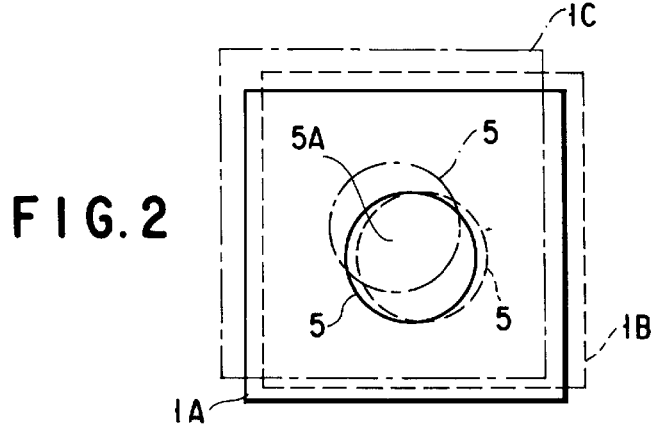
FIG. 2 is a view for explaining a method of aligning chips in the first embodiment.
Figures 3A, 3B:
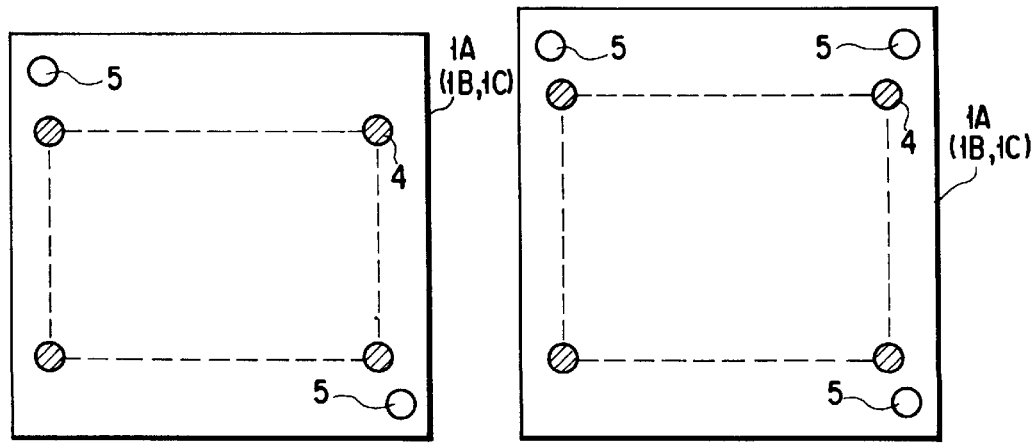
FIGS. 3A and 3B are views showing planar patterns of alignment holes applicable to the multi-chip semiconductor device shown in FIG. 1.

FIG. 1 is a sectional view showing a multi-chip semiconductor device according to this first embodiment. FIG. 2 is a view for explaining a method of aligning chips in this multi-chip semiconductor device. FIGS. 3A and 3B show examples of planar patterns of alignment holes.

In the multi-chip semiconductor device of this first embodiment, three chips 1A, 1B, and 1C (chips for a multi-chip semiconductor device) are stacked.

Each of the chips 1A, 1B, and 1C roughly comprises a silicon substrate 2 on which elements are integrally formed, a multilevel interconnecting layer 3 for connecting these elements in a desired manner, a plurality of conductive through plugs 4 (conductive plugs) extending through the silicon substrate 2 to electrically connect the chips, and an alignment hole 5 (light-transmitting portion) for transmitting light used in aligning the chips in the step of connecting the chips.

These chips 1A, 1B, and 1C have the same size (the area and the shape) and need to be stacked without any deviation. Although only one alignment hole 5 is shown in FIG. 1 for simplicity, at least two alignment holes 5 must be formed in each chip. These alignment holes 5 are formed in the same position of the chips 1A, 1B, and 1C. Note that the chips 1A, 1B, and 1C are not always required to have the same shape and the same area. If this is the case, however, the alignment holes 5 must be so formed in these chips that these alignment holes are vertically aligned with no difference when the chips are stacked in a desired manner.

An insulating interlayer constituting the multilevel interconnecting layer 3 is made of a material (e.g., $SiO_2$) which transmits light. An insulating film 6 is formed between the through plug 4 and the silicon substrate 2, and this insulating film 6 and the through plug 4 constitute a connecting plug.

Pads 7 are formed in the multilevel interconnecting layer 3 of each of the chips 1A, 1B, and 1C. Also, a silicon region of the silicon substrate 2 away from the pad 7, i.e., a silicon region except for the through plugs 4 and the alignment hole 5 in each of the chips 1A, 1B, and 1C is covered with an insulating film 8.

The through plugs 4 of the chip 1A are electrically connected via solder bumps 9 to the pads 7 formed in the multilevel interconnecting layer 3 of the chip 1B. Consequently, the chips 1A and 1B are electrically connected. Note that bumps other than the solder bumps 9 can also be used.

Similarly, the through plugs 4 of the chip 1B are electrically connected via solder bumps 9 to the pads 7 formed in the multilevel interconnecting layer 3 of the chip 1C. Consequently, the chips 1B and 1C are electrically connected. In this way the chips 1A, 1B, and 1C are electrically connected.

A material which transmits a laser beam, e.g., a silicon oxide film ($SiO_2$ film) 10 is buried in the alignment hole 5 of each of the chips 1A, 1B, and 1C. The alignment holes 5 in the same position of these chips are at least partially aligned in the stacking direction of the chips.

In this embodiment, the alignment hole 5 is filled with the silicon oxide film 10. However, the alignment hole 5 can also be filled with another film which transmits a laser beam, and can also be kept unfilled. That is, the alignment hole 5 need only have a function of transmitting light used in alignment.

With these alignment holes 5, alignment as will be described below can be executed.

A laser light source 11 is arranged below the lowermost chip 1C. A laser beam 12 emitted from this laser light source 11 enters from the alignment hole 5 in the lowermost chip 1C and is sequentially transmitted through the alignment holes 5 in the chips 1B and 1A. The transmitted laser beam 12 is sent into a photodetector 13 arranged above the alignment hole 5 in the uppermost chip 1A and constituted by, e.g., a photomultiplier. Note that the photodetector 13 and the laser light source 11 can also be arranged below the lowermost chip 1C and above the uppermost chip 1A, respectively.

As shown in FIG. 2, the amount of the laser beam 12 fed into the photodetector 13 is a maximum when the projection area in which the photodetector 13 can be seen from the laser light source 11 through the alignment holes 5 is a maximum. Referring to FIG. 2, this projection area is a common area of the alignment holes 5, i.e., a common area 5A of alignment holes 5 indicated by the solid line, the alternate long and short dashed line, and the broken line.

Accordingly, the chips 1A, 1B, and 1C can be aligned by adjusting the positional relationship between these chips so that the light amount is a maximum. In this adjustment, the larger the light amount the closer the connecting portion such as the pad 7 of each chip to a desired position (where the chips are not misaligned). Therefore, as described previously, the alignment holes 5 and the pads 7 of the chips are so formed as to be vertically aligned when the chips are stacked in desired positions.

Furthermore, a change in the projection area is sensitively reflected on the amount of the laser beam 12 incident on the photodetector 13. Consequently, the chips can be aligned with high accuracy.

This eliminates the need for forming pads having a relatively large area by taking misalignment into consideration, unlike in conventional structures. Therefore, it is possible to form a large number of pads in a chip and reduce the parasitic resistance in the interconnecting layer.

FIGS. 3A and 3B show practical examples of planar patterns of the alignment holes 5.

FIG. 3A shows an example in which two alignment holes 5 are formed in positions close to the corners on a diagonal line of each chip. With this arrangement of the alignment holes 5, when a step of electrically connecting the chips is performed, the chips can be aligned with high accuracy with minimum necessary numbers of alignment holes 5 and an alignment mechanism (a pair of a laser light source and a photodetector).

FIG. 3B shows an example in which two alignment holes 5 are formed in positions close to the corners on a diagonal line of each chip, and one alignment hole 5 in a position close to another corner of the chip. Basically, the larger the number of the alignment holes 5 the higher the alignment accuracy.

In the first embodiment described above, the chips 1A, 1B, and 1C are stacked. This eliminates the problem of an increase in the planar area of the device unlike in conventional multi-chip semiconductor devices in which a plurality of chips are arranged two-dimensionally.

Also, in this first embodiment the chips are connected by the through plugs 4 extending through the silicon substrates 2. Therefore, the number of chips to be stacked is not limited to two unlike in conventional multi-chip semiconductor devices in which chips are connected face to face.

Furthermore, no stacked plate is used to connect chips. Therefore, unlike in conventional multi-chip semiconductor devices in which chips are connected by a stacked plate, the structure is not complicated, and the thickness of the whole device is not increased.

Additionally, the through plug 4 has an effect of promoting heat dissipation. In this first embodiment, therefore, it is possible to realize a multi-chip semiconductor device having a small planar area, a simple structure, a small thickness, and good heat dissipation properties.

In the above first embodiment, the number of chips is three. However, four or more chips can be similarly connected when the chip structure of this embodiment is used. Also, not all of chips having the through plugs 4 need to be connected via these through plugs 4. That is, the through plugs 4 can also be formed only for the purpose of improving the heat dissipation properties in some chips.

In the first embodiment, the through plugs 4 are formed in all chips. However, this is not always necessary. For example, the chips 1A and 1C need only be connected to the chip 1B, so it is not always necessary to form the through plugs 4.

As described above, the through plug 4 has the effect of encouraging heat dissipation. The alignment hole 5 also has this effect of promoting heat dissipation. Accordingly, in addition to the arrangements of the alignment holes explained with reference to FIGS. 3A and 3B, it is possible to promote heat dissipation in an intermediate chip by forming an alignment hole near a portion where heat is generated in the chip.

A method of manufacturing a multi-chip semiconductor device according to the second embodiment of the present invention will be described below with reference to FIGS. 4A to 4K.

FIGS. 4A to 4K are sectional views of a chip or a multi-chip semiconductor device in individual manufacturing steps.

In this second embodiment, a through hole extending through a semiconductor substrate is not directly formed because a semiconductor substrate is generally thick, so it is difficult to directly form a through hole.

First, a 1-$\mu$m thick $SiO_2$ mask pattern 22 is formed on a silicon substrate 21. Next, as shown in FIG. 4A, this mask pattern 22 is used as a mask to selectively etch the silicon substrate 21 by RIE (Reactive Ion Etching), thereby forming a plurality of 100-$\mu$m deep holes 23 in the surface of the silicon substrate 21. An example of the etching source is F (fluorine)-based gas. Some of the holes 23 are finally used as through holes for connecting plugs, and the rest are used as through holes for alignment holes.

As shown in FIG. 4B, after the mask pattern 22 is removed, a 100-nm thick $SiO_2$ film and a 100-nm thick $Si_3N_4$ film are sequentially deposited on the entire surface by CVD (Chemical Vapor Deposition), forming an $SiO_2$/$Si_3N_4$ stacked insulating film 24. Note that a single-layered insulating film can also be used instead of the stacked insulating film 24.

Next, as shown in FIG. 4C, a silicon oxide film 25 (optical transparent film) is formed on the entire surface by using CVD such that the film 25 overflows from the holes 23. Consequently, the holes 23 are filled with the silicon oxide film 25. This silicon film 25 finally remains only in alignment holes.

As shown in FIG. 4D, CMP (Chemical Mechanical Polishing) is used to polish the surface of the silicon oxide film 25 until the surface of the stacked insulating film 24 is exposed. The result is a structure in which the silicon oxide film 25 is buried in the holes 23.

Figure 4E:
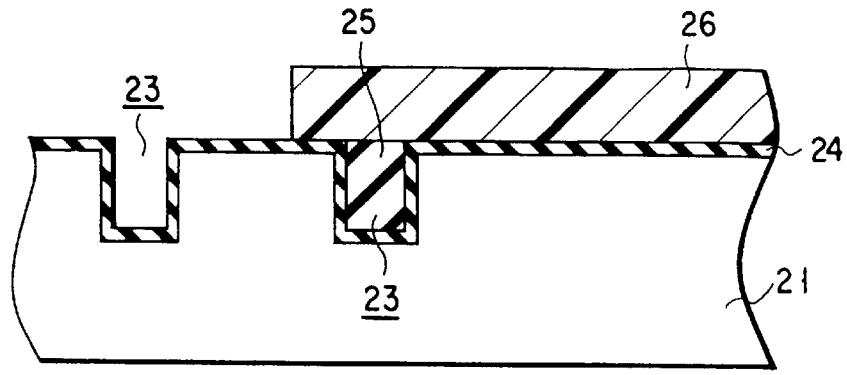

Next, as shown in FIG. 4E, a 1-$\mu$m thick resist mask pattern 26 is formed on the stacked insulating film 24 and used as a mask to selectively remove the silicon oxide film 25 buried in the hole 23 for a connecting plug. Consequently, the silicon oxide film 25 is selectively left behind only in the hole 23 for an alignment hole on the right side of FIG. 4E.

Figure 4F:
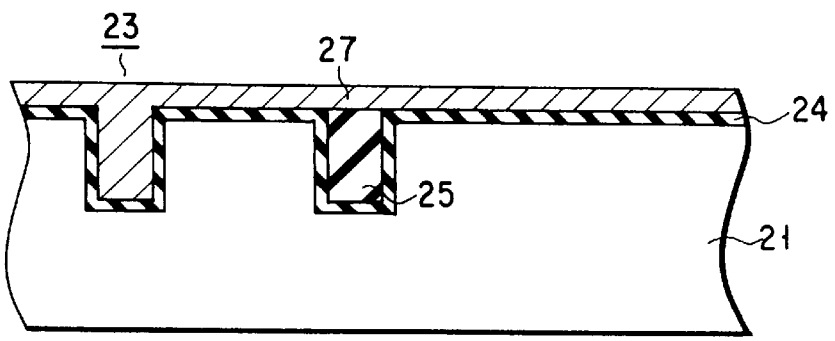

As shown in FIG. 4F, after the mask pattern 26 is peeled, an amorphous silicon film 27 which is used as the material of a through plug and into which an impurity such as B (boron) is doped is formed on the entire surface such that the film 27 overflows from the holes 23. Consequently, the hole 23 for a connecting plug on the left side of FIG. 4F is filled with the amorphous silicon film 27.

In this embodiment, the impurity-doped polysilicon film 27 is used as a conductive film serving as a through plug. However, an impurity-doped amorphous silicon film can also be used instead of the film 27. It is also possible to use a metal film made of, e.g., Al, Cu, W, Mo, Ni, or Ti, or a metal silicide film of any of these metals.

Figure 4G:
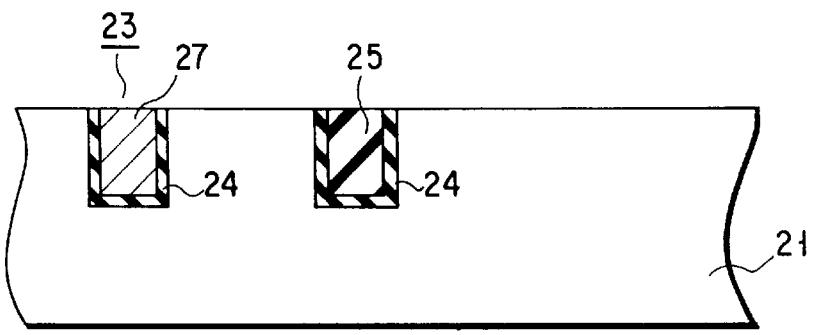

Next, as shown in FIG. 4G, CMP is used to polish the surface of the amorphous silicon film 27 until the surface of the silicon substrate 21 is exposed. The result is a structure in which the amorphous silicon film (through plug) 27 is buried in the hole 23 for a connecting plug.

Figure 4H:
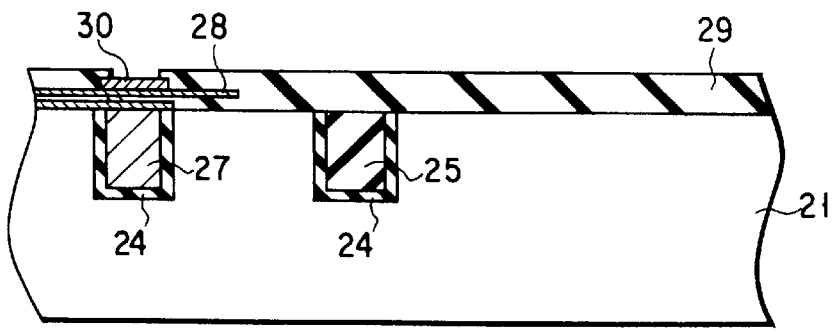

As shown in FIG. 4H, a multilevel interconnecting layer including a multilevel metal interconnection 28 and a light-transmitting insulating interlayer 29 is formed on the surface of the substrate in which the holes 23 are formed. An example of the insulating interlayer 29 is an $SiO_2$ film.

Note that the insulating interlayer 29 between layers of the multilevel metal interconnection 28 is omitted in FIG. 4H. Note also that element isolation and element formation must be performed before the multilevel interconnecting layer is formed.

It is also necessary that only the insulating interlayer 29 between the layers of the interconnection as the component of the multilevel interconnecting layer be formed and the multilevel metal interconnection 28 be not present in a region (alignment region) immediately above the silicon oxide film 25. This is to prevent the multilevel metal interconnection 28 from disturbing the detection of light transmitted through an alignment hole. However, this is unnecessary if a transparent metal material such as ITO is used as the material of the multilevel metal interconnection 28.

Next, as shown in FIG. 4H, a trench is formed in the surface of the insulating interlayer 29 on the multilevel metal interconnection 28, and a metal pad 30 is formed in this trench. At this point, the semiconductor substrate 21 is cut out into a chip or chips from the wafer.

As shown in FIG. 4I, the surface (lower surface) of the silicon substrate 21 away from the surface in which the holes 23 are formed is polished by using CMP until the stacked insulating film 24 on the bottoms of the holes 23 is exposed.

As in this second embodiment, the silicon substrate 21 is preferably polished after the silicon substrate 21 is cut out from the wafer. This is so because a wafer is generally large and has small mechanical strength and hence is difficult to evenly polish.

Next, as is still shown in FIG. 4I, the lower surface of the silicon substrate 21 is selectively etched. This etching amount is larger than the film thickness of the stacked insulating film 24 on the bottoms of the holes 23. Thereafter, as shown in FIG. 4I, a silicon oxide film ($SiO_2$ film) 31 is formed on the entire lower surface.

As shown in FIG. 4J, CMP is used to polish the silicon oxide film 31 and the stacked insulating film 24 until the silicon oxide film 25 and the amorphous silicon film (through plug) 27 are exposed.

The result is a structure in which a connecting plug is formed by filling the through hole with the through plug 27 via the stacked insulating film 24, an alignment hole is formed by filling the through hole with the silicon oxide film 25 via the stacked insulating film 24, and the silicon region on the lower surface of the silicon substrate 21 is covered with the silicon oxide film 31. Note that it is not always necessary to cover the silicon region on the lower surface with the silicon oxide film 31.

In this second embodiment as described above, even if the silicon substrate 21 is thick (the substrate is usually thick), no deep through holes need to be formed. Consequently, it is readily possible to form a chip (for a multi-chip semiconductor device) having a connecting plug formed by filling a through hole with the through plug 27 and an alignment hole formed by filling a through hole with the silicon oxide film 25 (transparent film).

Thereafter, as shown in FIG. 4K, three chips 21A to 21C formed by the same steps as above are vertically arranged. Before this step, solder bumps 32 are formed on the pads 30 of the chips 21B and 21C. The alignment holes in these chips are at least partially aligned in the stacking direction of the chips.

Next, as is still shown in FIG. 4K, a laser light source 11 below the chip 21C irradiates a laser beam 12 onto the lower surface of the alignment hole 25 in the chip 21C. This laser beam 12 sequentially passes through the alignment holes in the chips 21C, 21B, and 21A and is output from the surface of the chip 21A. This output laser beam is detected by a laser detector 13 mounted above the chip 21A.

The chips 21A, 21B, and 21C are so aligned that the amount of the laser beam 12 to be detected by the detector 13 is a maximum. Consequently, the connecting portions (the through plugs 27, the pads 30, and the solder bumps 32) of these chips are aligned. In this manner the chips 21A to 21C are easily aligned with high accuracy.

When the alignment is complete, the chip is heated by a heater (not shown) to a temperature at which the solder bumps 32 melt, and the chips are crimped by a crimping apparatus (not shown). Consequently, the chips are electrically connected to complete the multi-chip semiconductor device.

In the second embodiment as described above, multi-chip semiconductor device chips having light-transmitting portions for alignment are manufactured, and a multi-chip semiconductor device is manufactured by high-accuracy alignment using these light-transmitting portions.

This obviates the need for forming pads having a relatively large area by taking account of misalignment, unlike in conventional structures. Consequently, it is possible to form a large number of pads in a chip and reduce the parasitic resistance in the interconnecting layer.

A method of manufacturing a multi-chip semiconductor device according to the third embodiment of the present invention will be described below with reference to FIGS. 5A to 5G.

FIGS. 5A to 5G are sectional views showing a chip or a multi-chip semiconductor device in individual manufacturing steps. Note that the same reference numerals as in the second embodiment (FIGS. 4A to 4K) denote the same parts in FIGS. 5A to 5G, and a detailed description thereof will be omitted.

In this third embodiment, a method of manufacturing a multi-chip semiconductor device characterized in that an alignment hole is hollow will be described. The heat dissipation efficiency is improved by making an alignment hole hollow. This improvement in the heat dissipation efficiency helps prevent misalignment caused by a thermal expansion coefficient difference when chips are connected by heating and crimping.

Figure 5A:
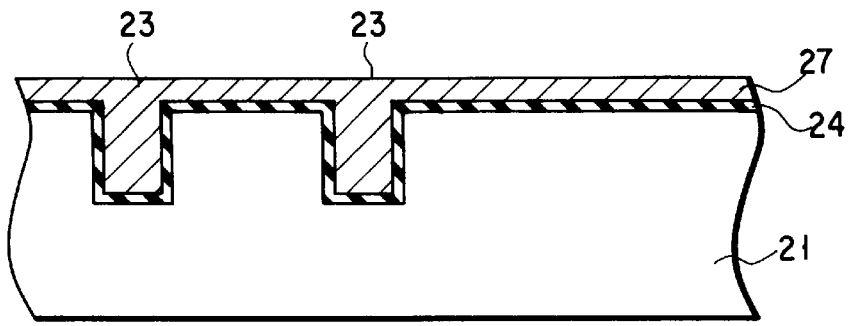
FIGS. 5A to 5G are sectional views for explaining a method of manufacturing a multi-chip semiconductor device according to the third embodiment of the present invention.

First, steps similar to the steps shown in FIGS. 4A and 4B of the second embodiment described above are executed. Thereafter, as shown in FIG. 5A, an amorphous silicon film 27 into which an impurity such as B (boron) is doped is formed on the entire surface so as to overflow from holes 23. Consequently, the holes 23 are filled with the amorphous silicon film 27.

Figure 5B:
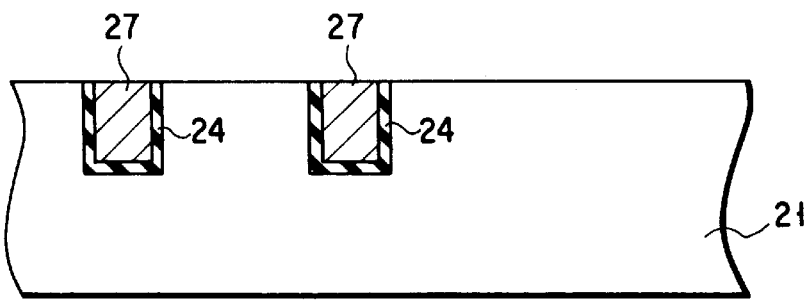

Next, as shown in FIG. 5B, CMP is used to polish the surface of the amorphous silicon film 27 until the surface of a silicon substrate 21 is exposed. The result is a structure in which the amorphous silicon film (through plug) 27 is buried in the hole 23 for a connecting plug on the left side of FIG. 5B. Although the amorphous silicon film 27 is also buried in the hole 23 for an alignment hole on the right side of FIG. 5B, this film 27 is finally removed.

Figure 5C:
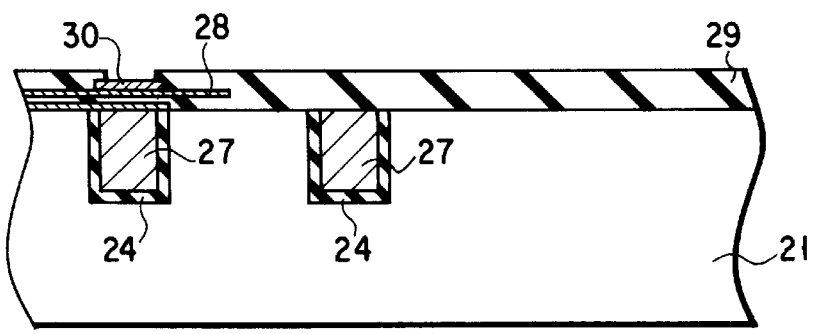

As shown in FIG. 5C, a multilevel interconnecting layer including a multilevel metal interconnection 28 and a light-transmitting insulating interlayer 29 is formed on the surface of the substrate in which the holes 23 are formed. An example of the insulating interlayer 29 is an $SiO_2$ film.

Note that the insulating interlayer 29 between layers of the multilevel metal interconnection 28 is omitted in FIG. 5C. Note also that element isolation and element formation must be performed before the multilevel interconnecting layer is formed.

It is also necessary that only the insulating interlayer 29 between the layers of the interconnection as the component of the multilevel interconnecting layer be formed and the multilevel metal interconnection 28 be not present in a region serving as an alignment hole. That is, the multilevel metal interconnection 28 is formed so as not to prevent the detection of light transmitted through an alignment hole. However, this is unnecessary if a transparent metal material such as ITO is used as the material of the multilevel metal interconnection 28.

Next, as shown in FIG. 5C, a trench is formed in the surface of the insulating interlayer 29 on the multilevel metal interconnection 28, and a metal pad 30 is formed in this trench.

Figure 5D:
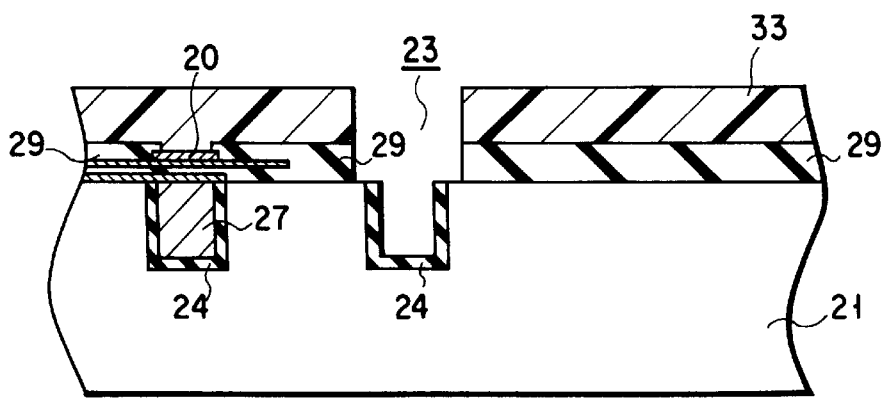

As shown in FIG. 5D, a resist mask pattern 33 is formed on the insulating interlayer 29 and used as a mask to sequentially selectively etch away the insulating interlayer 29 on and near the hole 23 as an alignment hole and the amorphous silicon film 27 in the hole 23 as an alignment hole. As this etching, anisotropic etching (dry etching) such as RIE is used, and wet etching can also be used.

Thereafter, the mask pattern 33 is peeled. At this point, the semiconductor substrate 21 is cut out into a chip or chips from the wafer.

Figure 5E:
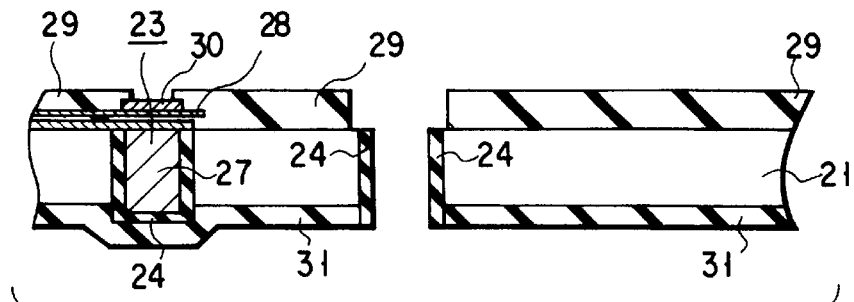

As shown in FIG. 5E, the surface (lower surface) of the silicon substrate 21 away from the surface in which the holes 23 are formed is polished by using CMP until a stacked insulating film 24 on the bottoms of the holes 23 is exposed.

Next, as is still shown in FIG. 5E, the lower surface of the silicon substrate 21 is selectively etched. This etching amount is larger than the film thickness of the stacked insulating film 24 on the bottoms of the holes 23. Thereafter, as shown in FIG. 5E, a silicon oxide film ($SiO_2$ film) 31 is formed on the entire lower surface.

Figure 5F:
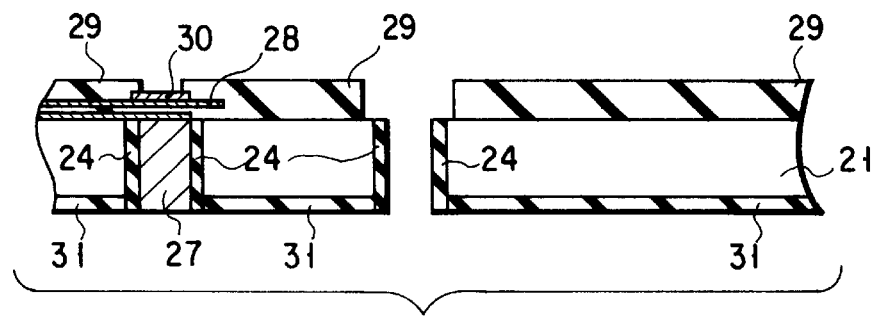

As shown in FIG. 5F, CMP is used to polish the silicon oxide film 31 and the stacked insulating film 24 until the amorphous silicon film (through plug) 27 is exposed.

The result is a structure in which a connecting plug is formed by filling the through hole with the through plug 27 via the stacked insulating film 24, an alignment hole is formed by making the through hole hollow, and the silicon region on the lower surface of the silicon substrate 21 is covered with the silicon oxide film 31. Note that it is not always necessary to cover the silicon region on the lower surface with the silicon oxide film 31.

Figure 5G:
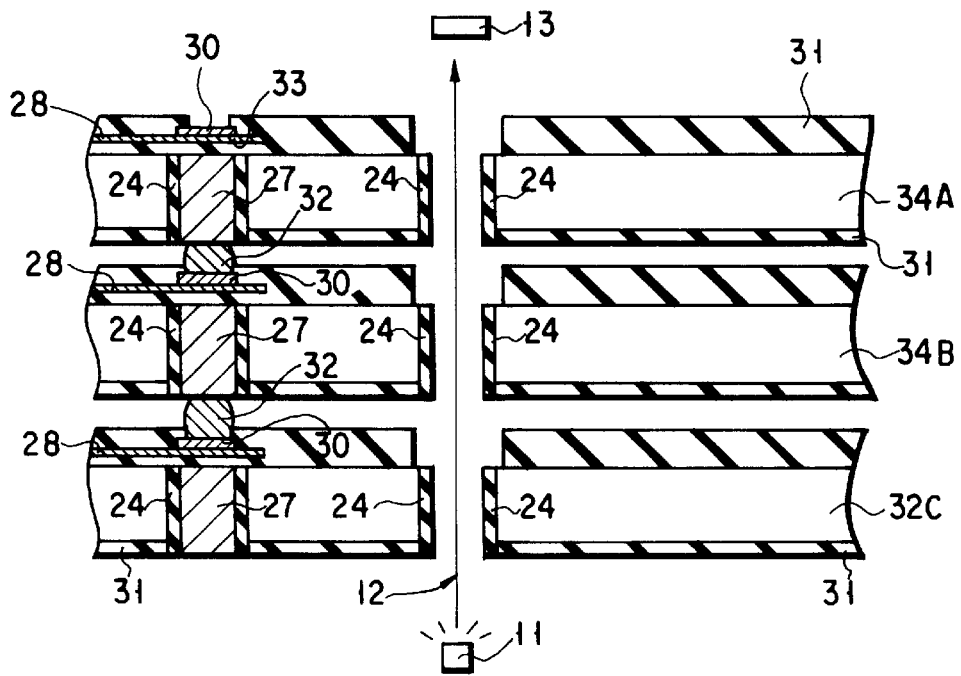

Thereafter, three chips 34A to 34C formed by the same steps as explained with reference to FIGS. 5A to 5F are vertically arranged (FIG. 5G). Before this step, solder bumps 32 are formed on the pads 30 of the chips 34B and 34C. The alignment holes in these chips are at least partially aligned in the stacking direction of the chips.

Next, as is still shown in FIG. 5G, a laser light source 11 underneath the chip 34C irradiates a laser beam 12 into the alignment hole in the chip 34C. This laser beam 12 sequentially passes through the alignment holes in the chips 34C, 34B, and 34A and is output from the surface of the chip 34A. This output laser beam is detected by a laser detector 13 mounted above the chip 34A.

The chips 34A, 34B, and 34C are so aligned that the amount of the laser beam 12 to be detected by the detector 13 is a maximum, thereby aligning the connecting portions of these chips. In this manner the chips 34A to 34C can be easily aligned with high accuracy.

When the alignment is complete, the chip is heated by a heater (not shown) to a temperature at which the solder bumps 32 are melted, and the chips are crimped by a crimping apparatus (not shown). Consequently, the chips are electrically connected to complete the multi-chip semiconductor device.

In the third embodiment as described above, multi-chip semiconductor device chips having hollow portions for alignment are manufactured, and a multi-chip semiconductor device is manufactured by performing high-accuracy alignment by using these hollow portions.

This obviates the need for forming pads having a relatively large area by taking account of misalignment, unlike in conventional structures. Consequently, it is possible to form a large number of pads in a chip and reduce the parasitic resistance in the interconnecting layer.

Also, the hollow portions for alignment are formed in this third embodiment, and these hollow portions have an effect of encouraging heat dissipation. Accordingly, as in the first embodiment described earlier, in addition to the arrangements of the alignment holes explained with reference to FIGS. 3A and 3B, it is possible to promote heat dissipation in an intermediate chip by forming an alignment hole near a portion where heat is generated in the chip.

An apparatus for manufacturing a multi-chip semiconductor device according to the fourth embodiment of the present invention will be described below with reference to FIGS. 6 to 8B.

Figure 6:
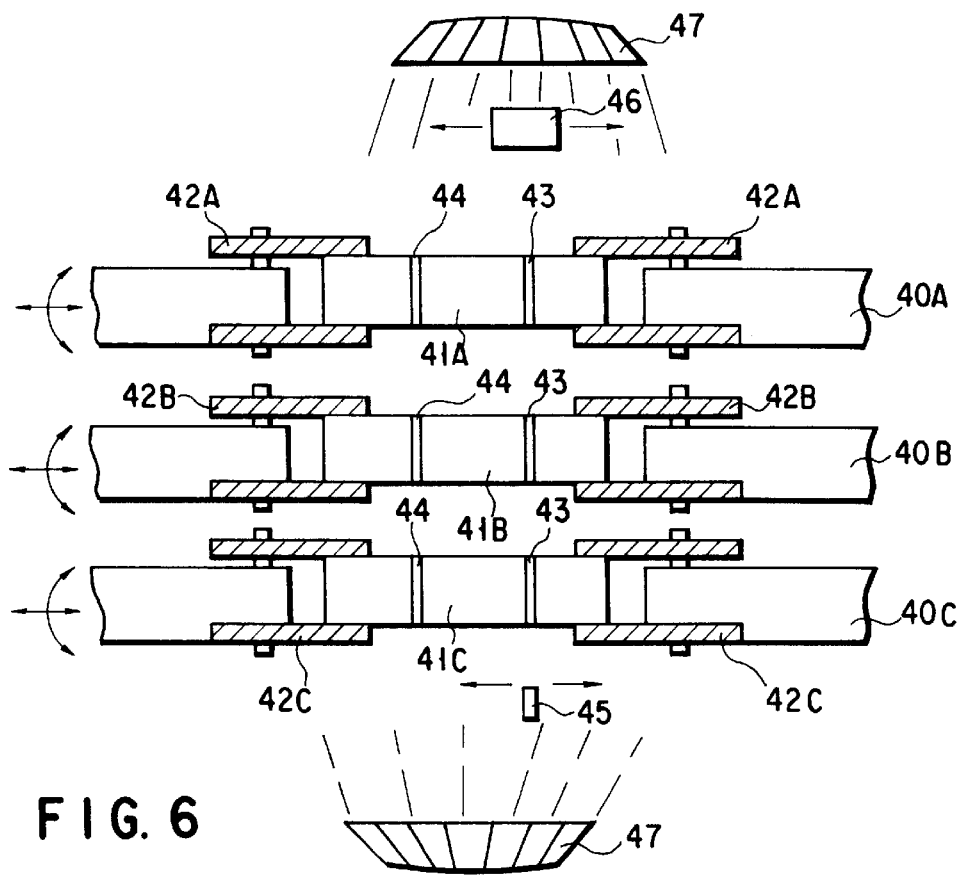
FIG. 6 is a view for explaining an apparatus for manufacturing a multi-chip semiconductor device according to the fourth embodiment of the present invention.
Figure 7:
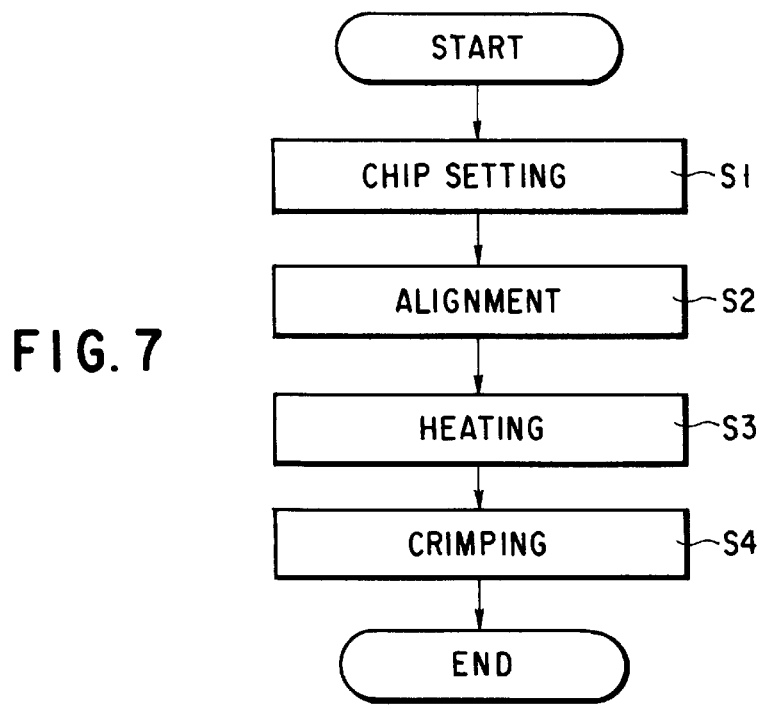
FIG. 7 is a flow chart for explaining a method of manufacturing a multi-chip semiconductor device by using the manufacturing apparatus shown in FIG. 6.
Figure 8A:
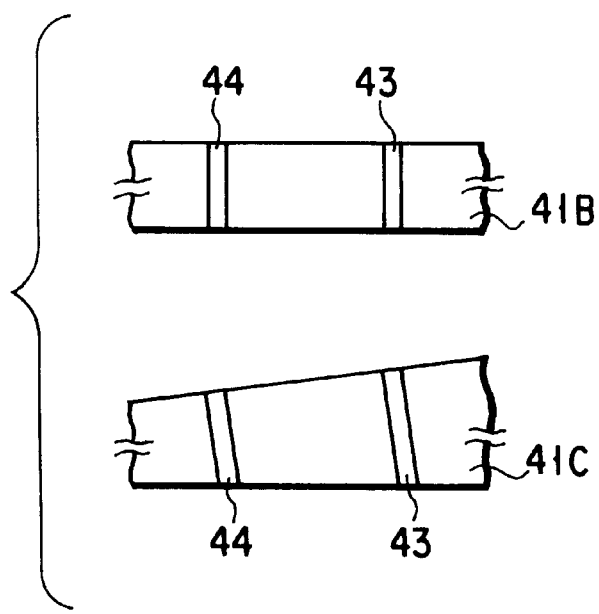
FIGS. 8A and 8B are views for explaining an effect when a stage is moved at an elevation angle in the manufacturing apparatus shown in FIG. 6.
Figure 8B:
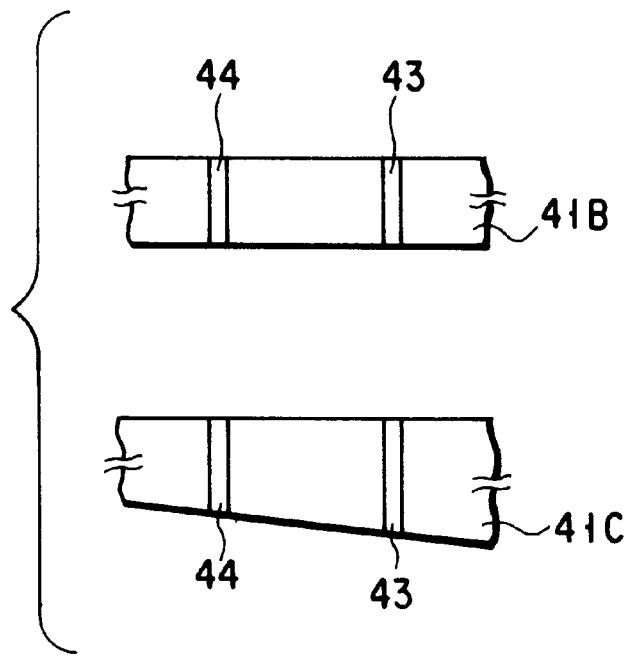

FIG. 6 is a view showing the apparatus for manufacturing the multi-chip semiconductor device according to this fourth embodiment. FIG. 7 is a flow chart showing a process of manufacturing the multi-chip semiconductor device by using this manufacturing apparatus. FIGS. 8A and 8B are views for explaining an effect when a stage of the manufacturing apparatus is moved at an elevation angle.

The manufacturing apparatus aligns and electrically connects chips manufactured by the manufacturing steps explained in the second or third embodiment.

In FIG. 6, reference numerals 40A, 40B, and 40C denote stages on which chips 41A, 41B, and 41C, respectively, are placed, and these stages are stacked. The stages 40A, 40B, and 40C have chip clamping mechanisms 42A, 42B, and 42C, respectively.

The chip clamping mechanisms 42A, 42B, and 42C clamp the chips 41A, 41B, and 41C, respectively, by two upper and lower clamping members. Consequently, each chip is placed on the lower clamping member and held between the upper and lower clamping members.

The chip clamping mechanisms 42A to 42C are placed in positions at which they do not collide with each other even during the chip connecting operation in which the chips are moved closest to each other. That is, the chip clamping mechanisms 42A to 42C are arranged in different positions in a direction perpendicular to the page so that they do not overlap each other when viewed from above.

Furthermore, the chip clamping mechanisms 42A to 42C are arranged so as not to cover alignment holes 43 and 44 and connecting plugs (not shown) of the chips 40A to 40C. That is, the chip clamping mechanisms 42A to 42C have through holes in regions corresponding to the alignment holes 43 and 44 and the connecting plugs. Consequently, it is possible to transmit a laser beam through all of the alignment holes 43 and 44 and connect the chips.

Note that the through holes in regions corresponding to the alignment holes 43 and 44 can also be filled with a film which transmits light. That is, the chip clamping mechanisms 42A to 42C can overlap the alignment holes provided that the overlapping portions are made of a material which transmits light.

Also, the stages 40A to 40C can be linearly moved in two directions (X- and Y-axis directions) parallel to planes in which the chips 41A to 41C are set and perpendicular to each other, linearly moved in a direction (Z-axis direction) perpendicular to the setting planes, and rotated about an axis parallel to the Z-axis direction by a stage position coarse adjustment unit (not shown). In this manner the positional relationship between the stages 40A to 40C can be coarsely adjusted. An example of a driving mechanism in the stage position coarse adjustment unit is a stage driving mechanism in a step apparatus.

Additionally, the stages 40A to 40C can be linearly moved and rotated with respect to the three axes described above by a stage position fine adjustment unit (not shown). In this way the positional relationship between the stages 40A to 40C can be finely adjusted. A stage driving mechanism in a step apparatus is an example of a driving mechanism in the stage position fine adjustment unit.

A laser light source 45 is arranged below the stage 40A, and a photodetector 46 above the stage 40C. The laser light source 45 and the photodetector 46 are aligned along the optical axis of a laser beam and can be linearly moved in the X- and Y-axis directions perpendicular to each other in the plane perpendicular to the optical axis.

It is necessary that the laser beam from the laser light source 45 be not absorbed by a material burying the alignment holes 43 and 44. In other words, a material that does not absorb the laser beam is used as the material for burying the alignment holes 43 and 44.

For example, when the alignment holes 43 and 44 are filled with $SiO_2$ having several absorption bands in the infrared region with a wavelength of 9 $\mu$m or more, it is preferable to use an He:Ne laser (wavelength 1.15 $\mu$m) or an Ar laser (wavelength 0.51 $\mu$m) having another wavelength. On the other hand, if the alignment holes 43 and 44 are left unfilled, it is only necessary to use a wavelength which is not largely absorbed by the atmosphere (e.g., the air) in the apparatus. The photodetector 46 is constituted by, e.g., a photomultiplier.

The detection result from the photodetector 46 is supplied to a controller (not shown). On the basis of the detection result from the photodetector 46, the controller controls the stage position coarse adjustment unit and the stage position fine adjustment unit described above.

Heaters 47 capable of heating up to a temperature at which solder bumps of chips melt are arranged above the stage 40A and below the stage 40C. Note that lamp heaters are shown as the heaters 47 in FIG. 6, but the heaters 47 are not limited to lamp heaters.

What is important is to prevent misalignment, when chip alignment is performed, caused by thermal expansion of the stages or the like resulting from the difference between the chip temperature and the chip adhesion temperature.

To this end, for example, it is only necessary to use a heat-insulating material (e.g., porous alumina) in that portion of the stage which is brought into contact with a chip or install an optical mechanism which condenses radiated light from a lamp heater onto a chip, so that only chips can be heated. Preferably, both of the two means are used. Alternatively, an RF heating apparatus which selectively heats solder bumps can be used. In short, it is only necessary to heat to a temperature at which solder bumps melt without any misalignment.

Note that the manufacturing apparatus of this fourth embodiment uses one alignment mechanism (a pair of laser light source 45 and photodetector 46). However, a plurality of alignment mechanisms can also be used. If this is the case, the alignment operation time is shortened although the construction is more or less complicated.

A method of manufacturing a multi-chip semiconductor device by aligning and electrically connecting the chips 41A to 41C by using the manufacturing apparatus with the above arrangement will be described below with reference to FIG. 7.

First, the chips 41A, 41B, and 41C are set and held by the stages 40A, 40B, and 40C, respectively (step S1). Solder bumps necessary for connection are previously formed on pads of the chips 41B and 41C. Subsequently, the chips 41A to 41C are aligned following the procedure explained below (step S2).

First, the stage position coarse adjustment unit coarsely moves the stage 40C linearly in the X- and Y-axis directions. That is, the stage 40C is set in a position where the amount of the laser beam detected by the photodetector 46 is a maximum.

Thereafter, the stage position fine adjustment unit finely moves the stage 40C linearly in the X- and Y-axis directions. As in the coarse adjustment, the stage 40C is set in a position where the amount of the laser beam detected by the photodetector 46 is a maximum.

Next, the stage position coarse adjustment unit coarsely moves the stages 40A and 40B linearly in the X- and Y-axis directions. That is, the stages 40A and 40B are set in positions where the amount of the laser beam detected by the photodetector 46 is a maximum.

Thereafter, the stage position fine adjustment unit finely moves the stages 40A and 40B linearly in the X- and Y-axis directions. As in the coarse adjustment, the stages 40A and 40B are set in positions where the amount of the laser beam detected by the photodetector 46 is a maximum.

Subsequently, the stage position coarse adjustment unit coarsely rotates the stages 40A and 40B about an axis parallel to the Z-axis direction. That is, the stages 40A and 40B are set in positions where the amount of the laser beam detected by the photodetector 46 is a maximum.

Finally, the stage position fine adjustment unit finely rotates the stages 40A and 40B about the axis parallel to the Z-axis direction. As in the coarse adjustment, the stages 40A and 40B are set in positions where the amount of the laser beam detected by the photodetector 46 is a maximum. In this manner the alignment of the chips 41A to 41C is completed.

Next, the chips 41A to 41C are electrically connected by heating and crimping (steps S3 and S4). That is, the heaters 47 heat the chips 41A to 41C to melt the solder bumps. At the same time, the stage position fine adjustment unit linearly moves the stages 40A to 40C in the Z-axis direction to crimp the chips. Consequently, the chips 41A to 41C are electrically connected. If necessary, the electrical connection can also be performed by the stage position coarse adjustment unit or by both the stage position fine adjustment unit and the stage position coarse adjustment unit.

In this fourth embodiment, alignment is performed by linearly moving and rotating the stages. However, elevation-angle movement can also be performed in addition to the movements in these directions.

For example, if the upper surface of the chip 41C has a tilt as shown in FIG. 8A, it is effective to move the chip 41C at an elevation angle so that the upper surface of the chip 41C is parallel to the lower surface of the chip 41B. Accordingly, when the chip 41C is moved as shown in FIG. 8B, alignment and connection can be performed in the same manner as when the upper surface has no tilt.

In the present invention as has been described in detail above, high-accuracy alignment can be performed by the use of multi-chip semiconductor device chips having light-transmitting portions (hollow portions) for alignment.

This obviates the need for forming pads having a relatively large area by taking account of misalignment, unlike in conventional structures. Consequently, it is possible to form a large number of pads in a chip and reduce the parasitic resistance in an interconnecting layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A chip applied to a multi-chip semiconductor device, comprising:

a semiconductor substrate on which at least one element is formed;

a connecting portion formed to extend through the semiconductor substrate and electrically connected to an adjacent chip via the conducting portions arranged on both surfaces of the semiconductor substrate; and two or more light-transmitting portions formed in the semiconductor substrate.

2. A chip according to claim 1, wherein the light-transmitting portions are through holes extending through the semiconductor substrate.

3. A chip according to claim 2, wherein an optical transparent material is buried in the through holes.

4. A multi-chip semiconductor device comprising:

a plurality of stacked chips; and a plurality of conducting portions each formed between the chips, wherein each of the chips comprises:

a semiconductor substrate on which at least one element is formed;

a connecting portion formed to extend through the semiconductor substrate and electrically connected to an adjacent chip via the conducting portions arranged on both surfaces of the semiconductor substrate; and two or more light-transmitting portions formed in the semiconductor substrate.

5. A device according to claim 4, wherein the light-transmitting portions are through holes extending through the semiconductor substrate.

6. A device according to claim 5, wherein an optical transparent material is buried in the through holes.

\* \* \* \* \*